(12) United States Patent
Chiang et al.

(10) Patent No.: US 8,884,209 B2
(45) Date of Patent: Nov. 11, 2014

(54) LIGHT DETERMINATION CIRCUIT

(71) Applicant: SerComm Corporation, Taipei (TW)

(72) Inventors: Meng-Chien Chiang, New Taipei (TW); Yuan-Chih Huang, New Taipei (TW)

(73) Assignee: SerComm Corporation, Taipei (TW)

( * ) Notice: Subject to any disclaimer, the term of this patent is extended or adjusted under 35 U.S.C. 154(b) by 190 days.

(21) Appl. No.: 13/748,625

(22) Filed: Jan. 24, 2013

(65) Prior Publication Data

US 2013/0292552 A1    Nov. 7, 2013

(30) Foreign Application Priority Data

May 7, 2012    (CN) .......................... 2012 1 0137865

(51) Int. Cl.
| | |
|---|---|
| *H01J 40/14* | (2006.01) |
| *H03K 17/78* | (2006.01) |
| *G01J 1/44* | (2006.01) |
| *G01R 31/26* | (2014.01) |

(52) U.S. Cl.
CPC . *H03K 17/78* (2013.01); *G01J 1/44* (2013.01); *G01R 31/26* (2013.01)
USPC ............. 250/214 SW; 250/214 R; 372/38.02; 372/38.03

(58) Field of Classification Search
USPC .... 250/214 R, 214 SW, 214 AG, 214 C, 206; 372/31, 38.01, 38.02, 38.03, 38.07, 372/38.1
See application file for complete search history.

(56) References Cited

U.S. PATENT DOCUMENTS

2006/0187982 A1* 8/2006 Knotz ........................ 372/38.02

* cited by examiner

*Primary Examiner* — Kevin Pyo
(74) *Attorney, Agent, or Firm* — McClure, Qualey & Rodack, LLP

(57) ABSTRACT

A light determination circuit having a laser module and a detection circuit is provided. The detection circuit comprises a threshold voltage determination unit, a comparison unit and a switch unit. The threshold voltage determination unit determines a threshold voltage corresponding to the laser module. The comparison unit is for comparing a voltage level at a first node of the laser module with the threshold voltage to output a switch signal. The switch unit is controlled by the switch signal to switch the voltage level at an output end of the detection circuit. When the laser module is conducted, the voltage level at the first node is lower than the threshold voltage, the switch signal controls the switch unit, such that the output end outputs a high level voltage and vice versa.

11 Claims, 2 Drawing Sheets

LIGHT DETERMINATION CIRCUIT

This application claims the benefit of People's Republic of China application Serial No. 201210137865.3, filed May 7, 2012, the subject matter of which is incorporated herein by reference.

TECHNICAL FIELD

The disclosure relates in general to a light determination circuit.

BACKGROUND

Conventionally, an amplifier circuit is used to determine whether a laser diode of the bidirectional optical subassembly (BOSA) illuminates and to inform a processor for subsequent processing. However, the amplifier circuit, which occupies a large area in the circuit layout, is very expensive, and does not meet modern products' requirements in terms of low cost and small size.

SUMMARY

The disclosure is directed to a light determination circuit, which uses simple circuit architecture to determine whether a laser module illuminates.

According to a first example of the present disclosure, a light determination circuit comprising a laser module and a detection circuit is provided. The laser module has a first node. The detection circuit has an output end. The detection circuit comprises a threshold voltage determination unit, a comparison unit and a switch unit. The threshold voltage determination unit determines a threshold voltage corresponding to the laser module. The comparison unit is coupled to the first node for comparing the voltage level at the first node with the threshold voltage to output a switch signal. The switch unit is controlled by the switch signal to switch the voltage level at the output end. When the laser module is conducted, the voltage level at the first node is lower than the threshold voltage, the switch signal controls the switch unit, such that the output end outputs a high level voltage. When the laser module is turned off, the voltage level at the first node is higher than the threshold voltage, the switch voltage controls the switch unit, such that the output end outputs a low level voltage.

According to a second example of the present disclosure, a light determination circuit comprising a laser diode, a threshold voltage determination unit, a first transistor, a second transistor and a third transistor is provided. The laser diode has an anode for receiving an operation voltage. The threshold voltage determination unit determines a threshold voltage corresponding to the laser module. An emitter of the first transistor is coupled to the operation voltage, a base of the first transistor is coupled to the cathode of the laser diode, and a collector of the first transistor is coupled to a ground voltage. An emitter of the second transistor is coupled to the emitter of the first transistor, a base of the second transistor is coupled to the operation voltage via the threshold voltage determination unit, and a collector of the second transistor is coupled to the ground voltage. An emitter of the third transistor is coupled to the base of the second transistor via the threshold voltage determination unit and coupled to the operation voltage to output an output signal. A base of the third transistor is coupled to the base of the second transistor, and a collector of the third transistor is coupled to the ground voltage.

According to a third example of the present disclosure, a light determination circuit comprising a laser module, a threshold voltage determination unit and a switch unit is provided. The laser module has a first node. The threshold voltage determination unit is coupled to the first node for determining a threshold voltage corresponding to the laser module and outputting a switch signal. The switch unit is controlled by the switch signal to switch the voltage level at an output end. When the laser module is conducted, the voltage level at the first node is lower than the threshold voltage, the switch signal controls the switch unit, such that the output end outputs a high level voltage. When the laser module is turned off, the voltage level at the first node is higher than the threshold voltage, the switch voltage controls the switch unit, such that the output end outputs a low level voltage.

The above and other contents of the disclosure will become better understood with regard to the following detailed description of the preferred but non-limiting embodiment(s). The following description is made with reference to the accompanying drawings.

DETAILED DESCRIPTION OF THE DISCLOSURE

The disclosure provides a light determination circuit, which uses simple circuit architecture to determine whether the laser module illuminates, hence reducing the cost.

Figure 1:
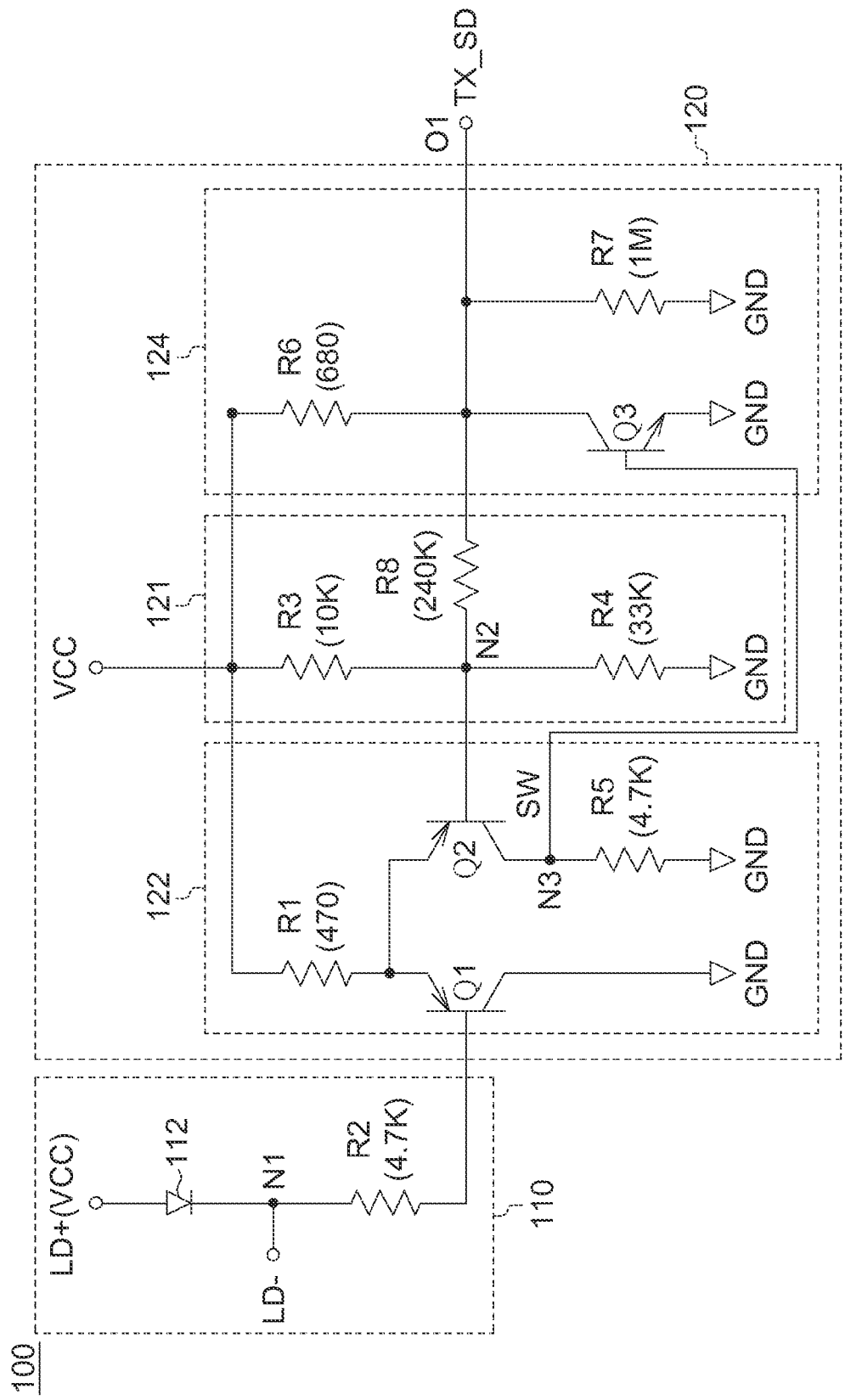
FIG. 1 shows a circuit diagram of a light determination circuit according to an embodiment.

Referring to FIG. 1, a circuit diagram of a light determination circuit according to an embodiment is shown. A light determination circuit 100 comprises a laser module 110 and a detection circuit 120. The laser module 110 has a first node N1 and a laser diode 112. The detection circuit 120 has an output end O1, a threshold voltage determination unit 121, a comparison unit 122 and a switch unit 124. The threshold voltage determination unit 121 determines a threshold voltage corresponding to the laser module 110. The threshold voltage determination unit 121 correspondingly determines the threshold voltage of the laser diode 112 of different brands. The comparison unit 122 is coupled to the first node N1 for comparing the voltage level at the first node N1 with the threshold voltage to output a switch signal SW. The switch unit 124 is controlled by the switch signal SW to switch the voltage level at the output end O1.

The laser diode 112 has an anode LD+ receiving an operation voltage VCC, and a cathode LD− coupled to the first node N1. The threshold voltage determination unit 121 is such as realized by a dividing circuit having a resistor R3 (such as 10KΩ), a resistor R4 (such as 33KΩ) and a resistor R8 (such as 240KΩ), but the disclosure is not limited thereto. The threshold voltage determination unit 121 determines the threshold voltage, that is, the voltage level at the second node N2. The comparison unit 122 comprises a first transistor Q1 and a second transistor Q2. The switch unit 124 comprises a third transistor Q3. In FIG. 1, the first transistor Q1 and the second transistor Q2 are exemplified by a PNP-type BJT, and the third transistor Q3 is exemplified by an NPN-type BJT, but the disclosure is not limited thereto. The emitter of the first transistor Q1 is coupled to the operation voltage VCC via a resistor R1 (such as 470Ω), the base of the first transistor Q1 is coupled to the cathode LD− of the laser diode 112 via a resistor R2 (such as 4.7KΩ), and the collector of the first transistor Q1 is coupled to a ground voltage GND.

The emitter of the second transistor Q2 is coupled to the emitter of the first transistor Q1. The base of the second transistor Q2 is coupled to the operation voltage VCC via the resistor R3 and coupled to the ground voltage GND via the resistor R4, and the collector N2 of the second transistor Q2 is coupled to the ground voltage GND via a resistor R5 (such as 4.7KΩ). The emitter of the third transistor Q3 (that is, the output end O1) is coupled to the operation voltage VCC via a resistor R6 (such as 680Ω) to output an output signal TX_SD, the base of the third transistor Q3 is coupled to the collector N3 of the second transistor Q2 for receiving the switch signal SW, and the collector of the third transistor Q3 is coupled to the ground voltage GND. In addition, the output end O1 is coupled to for example a CPU (not shown) for further processing. The resistor R7 is an input resistance of a next stage.

When the laser diode 112 is conducted, the voltage level at the cathode LD− is lower than the threshold voltage and thus the first transistor Q1 is conducted. Since the base-emitter voltage difference at the first transistor Q1 is greater than that at the second transistor Q2, the current flows to the first transistor Q1 but no current flows through the second transistor Q2. The voltage level at the collector N3 of the second transistor Q2, which is not boosted by the second transistor Q2 carrying no current, lowers down, the switch signal SW makes the third transistor Q3 turned off, and the voltage level at the output signal TX_SD is boosted to a high voltage level H. Thus, a following processor obtains that the laser diode 112 is conducted from the output signal TX_SD at high voltage level H.

When the laser diode 112 is turned off, the voltage level at the cathode LD− is higher than the threshold voltage and thus the first transistor Q1 is turned off. Current flows to the conducted second transistor Q2. The voltage level at the collector N3 of the second transistor Q2 is boosted by the conducted second transistor Q2, and the switch signal SW makes the third transistor Q3 conducted. The current flowing through the third transistor Q3 generates a tremendous voltage drop on the resistor R6, such that the voltage level at the output signal TX_SD lowers down to a low voltage level L. Thus, the following processor obtains that the laser diode 112 is turned off from the output signal TX_SD at low voltage level L.

Figure 2:
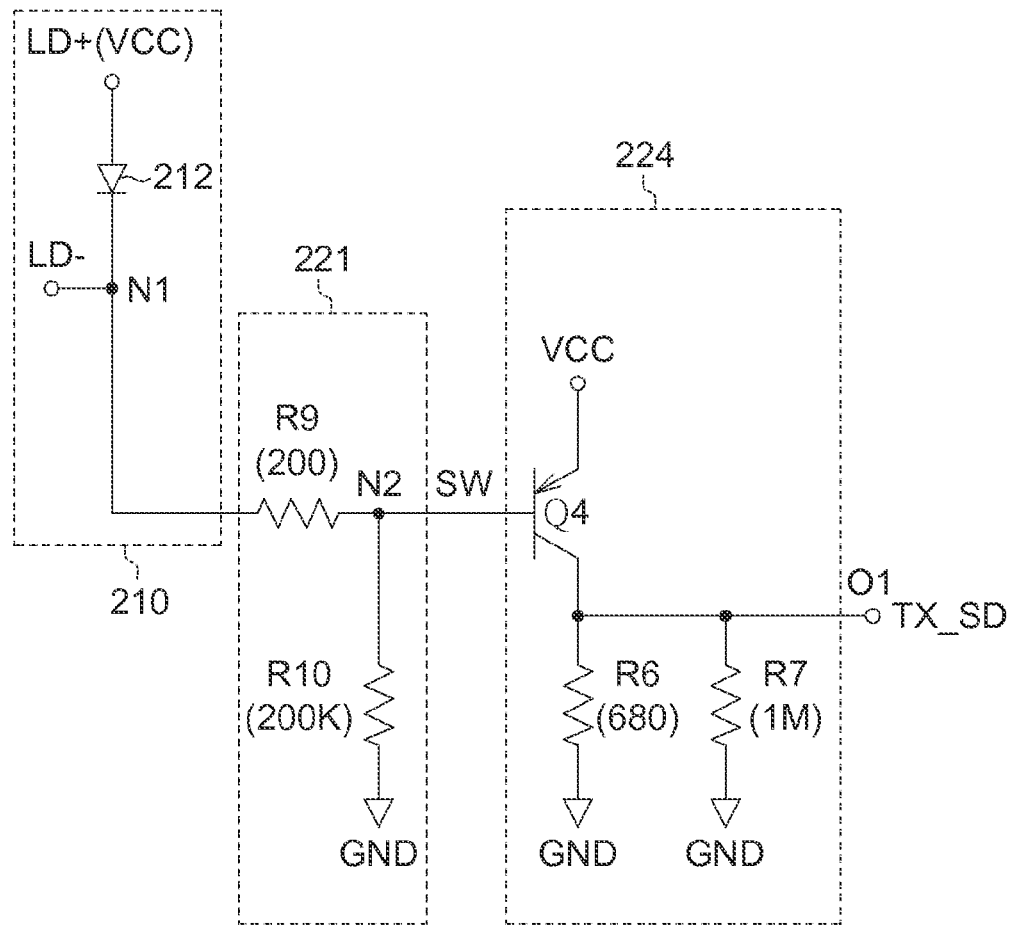
FIG. 2 shows a circuit diagram of a light determination circuit according to another embodiment.

In addition, the disclosure provides another light determination circuit embodiment. Referring to FIG. 2, a circuit diagram of a light determination circuit according to another embodiment is shown. The light determination circuit 200 comprises a laser module 210, a threshold voltage determination unit 221 and a switch unit 224. The laser module 221 has a first node N1. The threshold voltage determination unit 221 is coupled to the first node N1 for determining a threshold voltage corresponding to the laser module 210 and for outputting a switch signal SW. The threshold voltage determination unit 221 correspondingly determines the threshold voltage of the laser diode 212 of different brands. The switch unit 224 is controlled by the switch signal SW to switch the voltage level at an output end O1.

The laser diode 212 has an anode LD+ receiving an operation voltage VCC, and a cathode LD− coupled to the first node N1. The threshold voltage determination unit 221 is such as realized by a dividing circuit having a resistor R9 (such as 200Ω) and a resistor R10 (such as 200KΩ), but the disclosure is not limited thereto. The threshold voltage determination unit 221 determines the threshold voltage, that is, the voltage level at the second node N2. The switch unit 224 comprises a transistor Q4. In FIG. 2, the transistor Q4 is exemplified by a PNP-type BJT, but the disclosure is not limited thereto. The emitter of the transistor Q4 is coupled to the operation voltage VCC, the base of the transistor Q4 receives the switch signal SW, and the collector of the transistor Q4 is coupled to a ground voltage GND via a resistor R6. In addition, the output end O1 is coupled to for example a CPU (not shown) for further processing.

When the laser diode 212 is conducted, the voltage level at the cathode LD− is lower than the threshold voltage, the switch signal SW makes the transistor Q4 conducted, and the voltage level at the output signal TX_SD of the output end O1 is boosted to a high voltage level H. Thus, a following processor obtains that the laser diode 212 is conducted from the output signal TX_SD at high voltage level H. When the laser diode 212 is turned off, the voltage level at the cathode LD− is higher than the threshold voltage, the switch signal SW makes the transistor Q4 turned off, and the voltage level at the output signal TX_SD of the output end O1 lowers down to a low voltage level L. Thus, the following processor obtains that the laser diode 212 is turned off from the output signal TX_SD at low voltage level L. In comparison to the light determination circuit 100, the light determination circuit 200 occupies a smaller circuit area, and is applicable to a compact design with strict availability of space.

Figure 3:
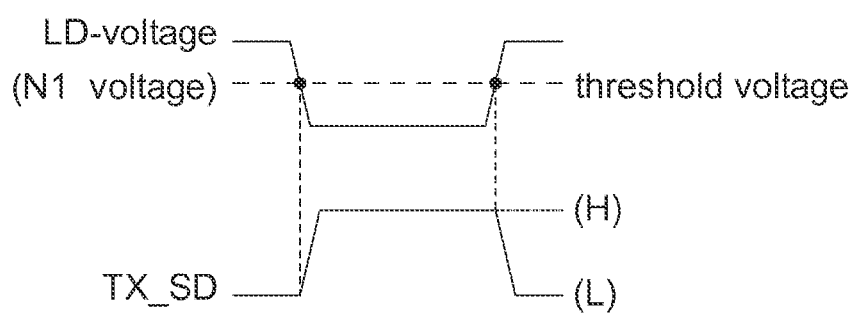
FIG. 3 shows voltage waveforms of a cathode LD− (a first node N1) and an output signal TX_SD according to an embodiment.

Referring to FIG. 3, voltage waveforms of the voltage level at the cathode LD− (the first node N1) and the voltage level at the output signal TX_SD according to an embodiment are shown. When the voltage level at the cathode LD− is lower than a threshold voltage, that is, when the laser diode is conducted, the voltage level at the output signal TX_SD is starting to rise until high voltage level H. When the voltage level at the cathode LD− is higher than the threshold voltage, that is, when the laser diode is turned off, the voltage level at the output signal TX_SD is starting to decrease until low voltage level L.

According to the light determination circuit disclosed in the above embodiments of the disclosure, simple BJT circuit architecture suffices to determine whether the laser diode is conducted, and the following processor informs that whether the laser module illuminates. Since the light determination circuit does not use an expensive amplifier circuit, the cost and the circuit area are reduced, such that modern products' requirements in terms of low cost and small size are satisfied.

In addition, the threshold voltage determination circuit may set the threshold voltage at the first node for determining the transition timing at the output signal of the output end. Therefore, the light determination circuit of the disclosure is applicable to the laser diode of different brands and makes.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light determination circuit, comprising:
   a laser module having a first node; and
   a detection circuit having an output end, the detection circuit comprising:
      a threshold voltage determination unit for determining a threshold voltage corresponding to the laser module;
      a comparison unit coupled to the first node for comparing a voltage level at the first node with the threshold voltage to output a switch signal; and a switch unit controlled by the switch signal to switch a voltage level at the output end;

wherein, when the laser module is conducted, the voltage level at the first node is lower than the threshold voltage, the switch signal controls the switch unit, such that the output end outputs a high level voltage, and when the laser module is turned off, the voltage level at the first node is higher than the threshold voltage, the switch voltage controls the switch unit, such that the output end outputs a low level voltage.

2. The light determination circuit according to claim 1, wherein the laser module comprises a laser diode having an anode receiving an operation voltage and a cathode coupled to the first node.

3. The light determination circuit according to claim 2, wherein the comparison unit comprises:

a first transistor having an emitter coupled to the operation voltage, a base coupled to the first node, and a collector coupled to a ground voltage; and a second transistor having an emitter coupled to the emitter of the first transistor, a base coupled to the operation voltage and the output end via the threshold voltage determination unit, and a collector outputting the switch signal.

4. The light determination circuit according to claim 3, wherein the switch unit comprises:

a third transistor, having an emitter coupled to the operation voltage and the output end, a base receiving the switch signal, and a collector coupled to the ground voltage.

5. A light determination circuit, comprising:

a laser diode having an anode receiving an operation voltage;

a threshold voltage determination unit for determining a threshold voltage corresponding to the laser module;

a first transistor having an emitter coupled to the operation voltage, a base coupled to a cathode of the laser diode, and a collector coupled to a ground voltage;

a second transistor, having an emitter coupled to the emitter of the first transistor, a base coupled to the operation voltage via the threshold voltage determination unit, and a collector coupled to the ground voltage; and a third transistor, having an emitter coupled to the base of the second transistor via the threshold voltage determination unit and coupled to the operation voltage for outputting an output signal, a base coupled to the collector of the second transistor, and a collector coupled to the ground voltage.

6. The light determination circuit according to claim 5, wherein the first transistor and the second transistor both are a PNP-type BJT, and the third transistor is an NPN-type BJT.

7. The light determination circuit according to claim 6, wherein when the laser diode is conducted, a voltage level at the cathode is lower than the threshold voltage, the first transistor is conducted, no current flows through the second transistor, the voltage level at the collector of the second transistor lowers down, the third transistor is turned off, and the output signal is a high voltage level.

8. The light determination circuit according to claim 6, wherein when the laser diode is turned off, a voltage level at the cathode is higher than the threshold voltage, the first transistor is turned off, the second transistor is conducted, a voltage level at the collector of the second transistor is boosted, the third transistor is conducted, and the voltage level at the output signal is a low voltage level.

9. A light determination circuit, comprising:

a laser module having a first node;

a threshold voltage determination unit coupled to the first node for determining a threshold voltage corresponding to the laser module and outputting a switch signal; and a switch unit controlled by the switch signal to switch a voltage level at an output end;

wherein, when the laser module is conducted, a voltage level at the first node is lower than the threshold voltage, the switch signal controls the switch unit, such that the output end outputs a high level voltage, and when the laser module is turned off, the voltage level at the first node is higher than the threshold voltage, the switch voltage controls the switch unit, such that the output end outputs a low level voltage.

10. The light determination circuit according to claim 9, wherein the laser module comprises a laser diode having an anode receiving an operation voltage and a cathode coupled to the first node.

11. The light determination circuit according to claim 10, wherein the switch unit comprises:

a transistor, having an emitter coupled to the operation voltage and coupled to the output end, a base receiving the switch signal, and a collector coupled to the ground voltage;

wherein, when the laser module is conducted, a voltage level at the first node is lower than the threshold voltage, the transistor is conducted and the output end outputs the high level voltage, and when the laser module is turned off, the voltage level at the first node is higher than the threshold voltage, the transistor is turned off and the output end outputs the low level voltage.

\* \* \* \* \*